(12) United States Patent
Fan et al.

(10) Patent No.: US 9,420,690 B2
(45) Date of Patent: Aug. 16, 2016

(54) CONNECTOR

(71) Applicant: Unimicron Technology Corp., Taoyuan (TW)

(72) Inventors: Chih-Peng Fan, Taoyuan (TW); Ching-Ho Hsieh, Taoyuan (TW); Chung-Chi Huang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/720,979

(22) Filed: May 26, 2015

(65) Prior Publication Data

US 2015/0289374 A1 Oct. 8, 2015

Related U.S. Application Data

(63) Continuation of application No. 14/681,298, filed on Apr. 8, 2015.

(30) Foreign Application Priority Data

Apr. 8, 2014 (CN) .......................... 2014 1 0139132

(51) Int. Cl.
*H05K 1/11* (2006.01)
*H05K 1/02* (2006.01)
*H05K 3/00* (2006.01)
*H05K 3/06* (2006.01)
*H05K 3/28* (2006.01)
*H05K 3/40* (2006.01)

(52) U.S. Cl.
CPC ................ *H05K 1/115* (2013.01); *H05K 3/007* (2013.01); *H05K 3/06* (2013.01); *H05K 3/28* (2013.01); *H05K 3/4092* (2013.01); *H05K 1/0298* (2013.01); *H05K 1/113* (2013.01); *H05K 3/0097* (2013.01); *H05K 3/4007* (2013.01); *H05K 2201/09572* (2013.01); *H05K 2203/041* (2013.01); *H05K 2203/1536* (2013.01)

(58) Field of Classification Search
None
See application file for complete search history.

(56) References Cited

U.S. PATENT DOCUMENTS

| | | | | |
|---|---|---|---|---|
| 5,602,422 | A * | 2/1997 | Schueller | H01L 23/49816 257/737 |
| 6,713,685 | B1 * | 3/2004 | Cotton | H05K 1/0218 174/262 |
| 8,007,286 | B1 * | 8/2011 | Holec | H01R 4/02 439/65 |
| 2005/0092709 | A1 * | 5/2005 | Chun | G01R 1/06727 216/13 |
| 2013/0193533 | A1 * | 8/2013 | Vos | H04R 19/005 257/416 |

FOREIGN PATENT DOCUMENTS

TW        M38094 U1 * 9/2012

* cited by examiner

*Primary Examiner* — Shamim Ahmed
(74) *Attorney, Agent, or Firm* — Jianq Chyun IP Office

(57) ABSTRACT

The instant disclosure relates to a connector including a wiring layer, a dielectric layer, a conductive structure, a first protective layer and at least one cantilever structure. The dielectric layer is disposed on the wiring layer, wherein the dielectric layer has at least one via hole to partially expose the wiring layer. The conductive structure is disposed on the inner wall of the at least one via hole of the dielectric layer and electrically connected to the wiring layer. The first protective layer is disposed on the dielectric layer. The cantilever structure is disposed between the first protective layer and the dielectric layer, wherein the at least one cantilever structure is electrically connected to the wiring layer via the conductive structure.

15 Claims, 5 Drawing Sheets

CONNECTOR

CROSS-REFERENCE TO RELATED APPLICATION

This application is a continuation application of and claims the priority benefit of a prior application Ser. No. 14/681,298, filed on Apr. 8, 2015, now pending. The prior application Ser. No. 14/681,298 claims the priority benefit of China application serial no. 201410139132.2, filed on Apr. 8, 2015. The entirety of each of the above-mentioned patent applications is hereby incorporated by reference herein and made a part of this specification.

BACKGROUND OF THE INVENTION

1. Field of the Invention

The instant disclosure relates to a manufacturing method of connector; in particular, to a manufacturing method of connector with a relatively thin thickness.

2. Description of Related Art

The connector can be used as an electrical bridge for electrically connecting different electronic elements. Nowadays, various connectors are required for use in the 3C electronic devices, e.g., cell phones, notebooks, etc. For the trend of miniaturization of the 3C electronic devices, further miniaturization of the connector has been requested.

A conventional method for manufacturing the connector comprises providing a core layer formed with conductive vias and a circuit, and subsequently pressing a dielectric layer with at least one cantilever onto the core layer, wherein the at least one cantilever is connected to the circuit through the conductive vias. However, the conventional method must be subjected to via holes electroplating process to form the core layer with the conductive vias, thus resulting in a complex process. Besides, the connector cannot meet the miniaturization requirements due to its thickness.

SUMMARY OF THE INVENTION

The object of the instant disclosure is to provide a manufacturing method for a connector with a relatively thin thickness.

In order to achieve the aforementioned objects, according to an embodiment of the instant disclosure, a manufacturing method of connector comprises: providing a substrate layer and forming a first metal layer on the substrate layer; patterning the first metal layer to form a wiring layer; forming a dielectric layer on the wiring layer, wherein the dielectric layer is formed with at least one via hole to partially expose the wiring layer and a conductive structure arranged on the inner wall of the at least one via hole and electrically connected to the wiring layer; forming a first protective layer on the dielectric layer and at least one cantilever structure between the first protective layer and the dielectric layer, wherein the at least one cantilever structure is electrically connected to the wiring layer via the conductive structure; and removing the substrate layer.

Base on the above, at least one electrically conductive via coupled between the cantilever structure to the wiring layer can be formed without the use of a via hole plating method, whereby the overall process can be simplified in comparison with the conventional manufacturing method. Besides, the connector manufactured by the aforementioned method does not have any core layers, whereby the thickness of the connector can be reduced to meet the requirement of miniaturization.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Please refer to FIGS. 1A-1G, which are cross-sectional views schematically showing a process for manufacturing a connector according to a first embodiment of the present invention.

Figure 1A:
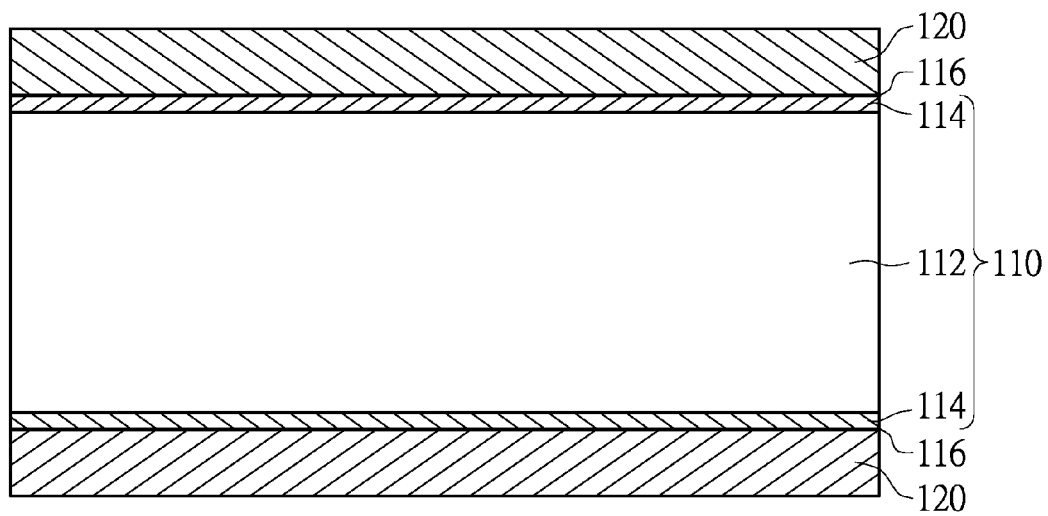
FIGS. 1A-1G are cross-sectional views schematically showing a process for manufacturing a connector according to a first embodiment of the present invention.

The first step, as shown in FIG. 1A, is to provide a substrate layer 110 and two first metal layers 120. For the instant embodiment, the substrate layer 110 includes a core layer 112, two second metal layers 114, and two release films 116. The second metal layers 114 are arranged on two opposite surfaces of the core layer 112. The release films 116 are arranged on the second metal layers 114 respectively, and configure to temporarily combine the substrate layer 110 to the first metal layer 120. Each of the first metal layers 120 has a thickness in a range between 15 µm and 25 µm, and each of the second metal layers 114 has a thickness in a range between 2 µm and 5 µm.

In general, the substrate layer 110 is disposed to act as a carrier of the subsequently formed electrical elements and circuits. That is, the substrate layer 110 can be a sheet laminate material (i.e., copper foil substrate) for use in manufacturing printed circuit boards. The core layer 112 can be made of a prepreg which is formed by impregnating a fibrous material such as carbon fiber or glass fiber with an epoxy resin. For example, the core layer 112 can be, made of a cyanate ester (CE) prepreg, a polyimide (PI) prepreg, or a bismaleimide (BMI) prepreg. The second metal layer 114 can be made of an aluminum-based material, a copper-based material, or a copper alloy. For example, the second metal layer 114 can be made of brass, phosphor bronze, berylliun alloy, or coalesced copper. The release film 116 is capable of easily peeling off from the second metal layer 114, such that the substrate layer 110 can easily be removed. However, the substrate materials are not restricted thereto.

Figure 1B:
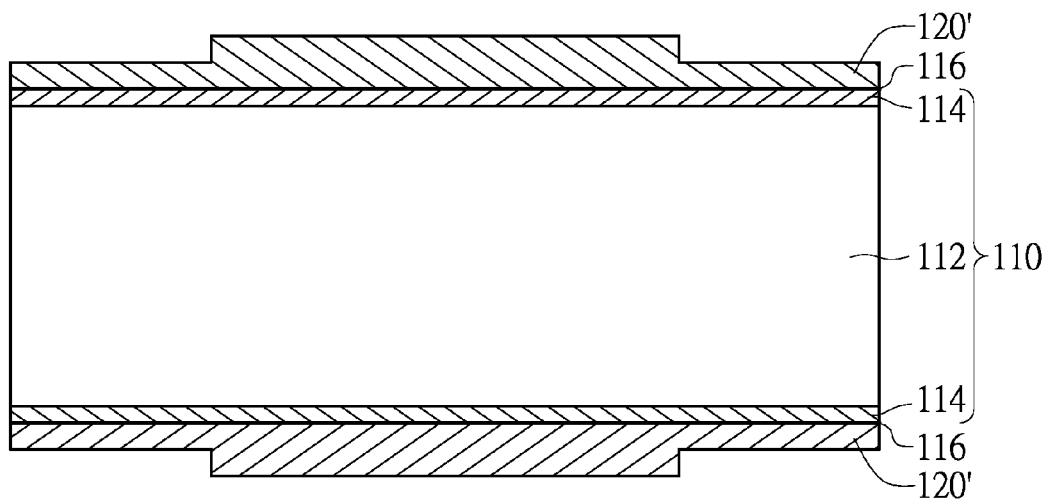

The next step, as shown in FIG. 1B, is to pattern the first metal layer 120 to form a wiring layer 120'. For the instant embodiment, the thickness of the first metal layer 120 is reduced by etching and mechanically polishing, and then a photolithography process and an etching process are conducted to selectively deposit a metal on the surface of the first metal layer 120. Specifically, a patterned photoresist layer is formed on the first metal layer 120, and the metal is sequentially formed on the uncovered portion of the first metal layer 120 to form the wiring layer 120'. In various embodiments, a subtractive method can be performed on the first metal layer 120 to form the wiring layer 120'. That is, the uncovered portion of the first metal layer 120 can be removed by etching.

Figure 1C:
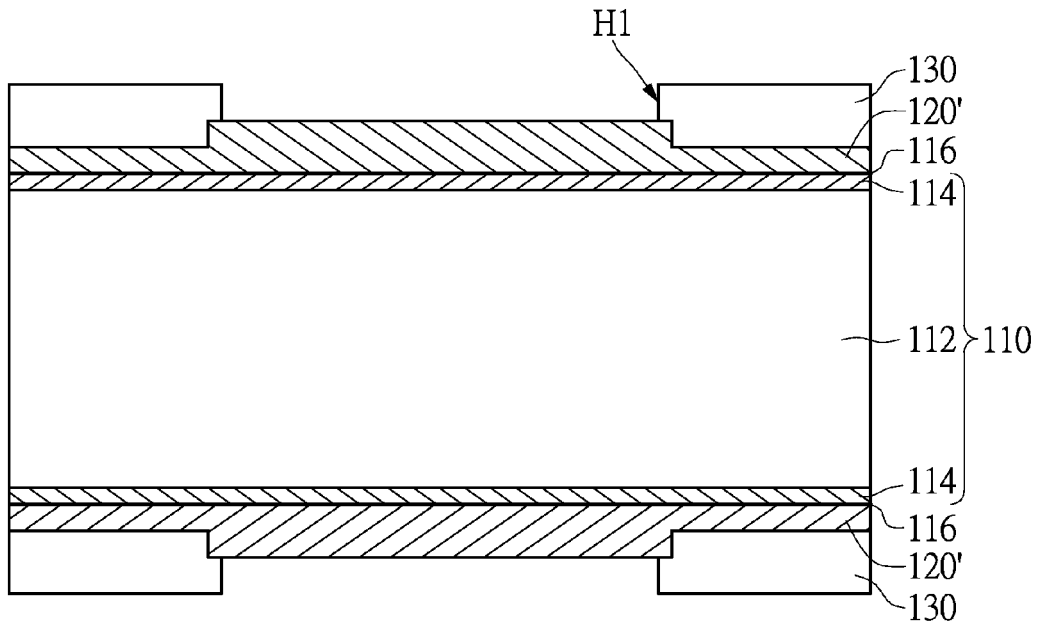

The next step, as shown in FIG. 1C, is to form a dielectric layer 130 on the wiring layer 120', wherein the dielectric layer 130 is formed with at least one via hole H1 to partially expose the wiring layer 120'. Specifically, the at least one via hole H1 can be foamed in the dielectric layer 130 before or after pressing the dielectric layer 130 onto the wiring layer 120', wherein a portion of the dielectric layer 130 can be removed by laser drilling. However, the present invention is not limited to the timing of the formation of the at least one via hole H1.

Figure 1D:
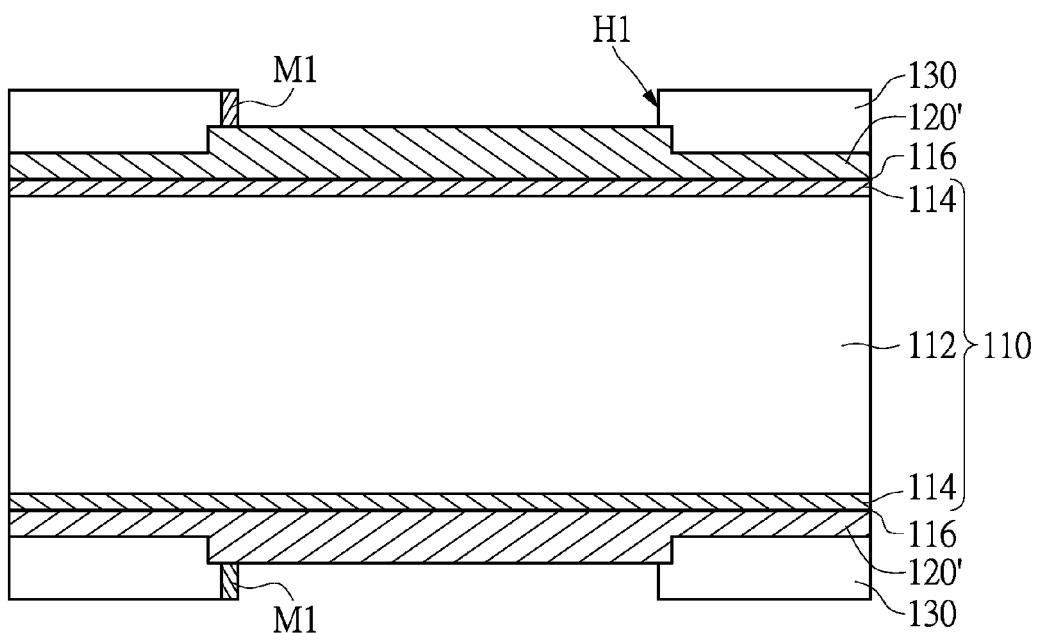

For the instant embodiment, the dielectric layer 130 can be made of the dielectric material exhibiting viscosity and low flowability such as a low/no flow prepreg. The dielectric layer 130 can be formed on the wiring layer 120' by printing or applying. The at least one via hole H1 can be formed in the dielectric layer 130 by mechanically drilling or laser trimming The next step, as shown in FIG. 1D, is to form a conductive structure M1 arranged on the inner wall of the at least one via hole H1 and electrically connected to the wiring layer 120'. Firstly, a photoresist or a dry film (not shown) is formed on the dielectric layer 130, wherein not only the outer surface of the dielectric layer 130 but also a portion of the inner wall of the at least one via hole H1 are covered by said photoresist or dry film. Next, a copper plating layer or a conductive paste such as a metal paste (i.e., copper paste or silver paste) or a conductive polymer is formed on the uncovered portion of the at least one via hole H1 to form the conductive structure M1. That is, at least part of the inner wall of the at least one via hole H1 are covered by the conductive structure M1.

However, in various embodiments, the at least one via hole H1 and the conductive structure M1 can be formed in the dielectric layer 130 after pressing the dielectric layer 130 onto the wiring layer 120'.

Figure 1E:
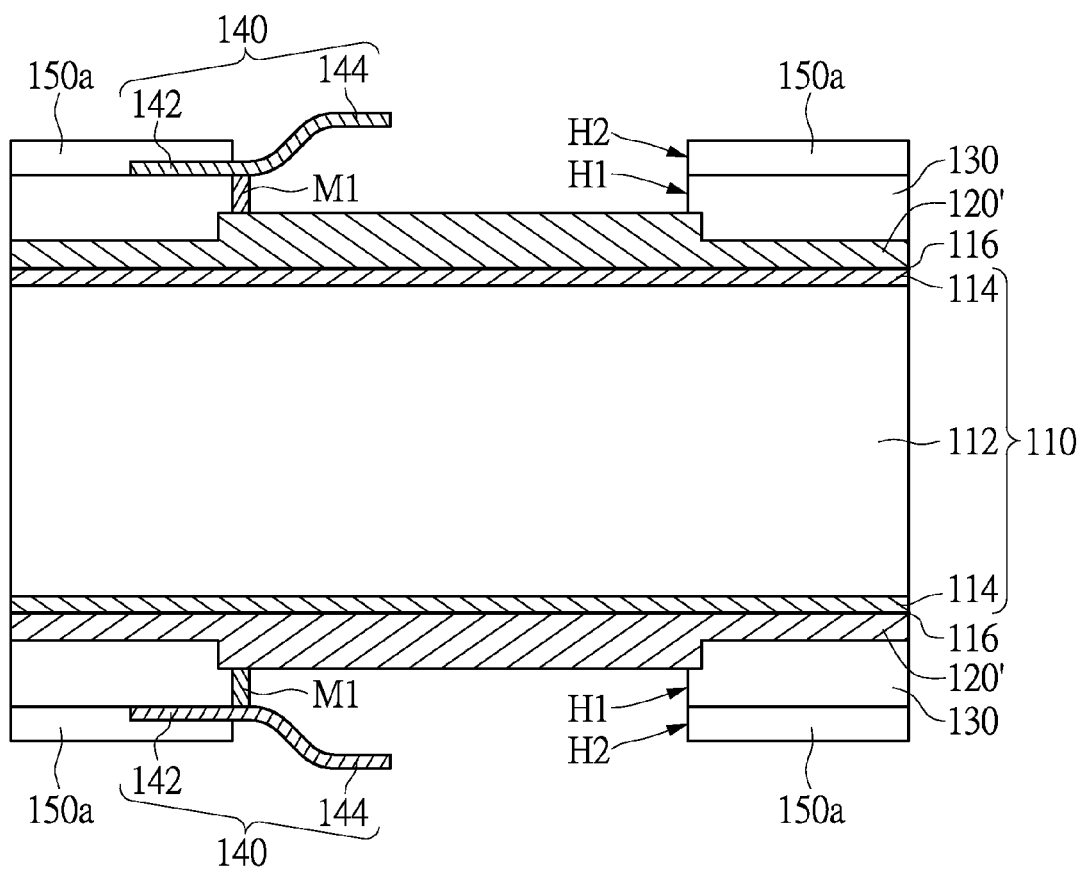

The next step, as shown in FIG. 1E, is to form a first protective layer 150a on the dielectric layer 130 and at least one cantilever structure 140 between the first protective layer 150a and the dielectric layer 130, wherein the at least one cantilever structure 140 is electrically connected to the wiring layer 120' via the conductive structure M1. Specifically, the cantilever structure 140 is positioned substantially in correspondence with the via hole H1 of the dielectric layer 130. The cantilever structure 140 has a fixing portion 142 and a free end portion 144. The fixing portion 142 is arranged in a peripheral region near the at least one via hole H1 and connected to the wiring layer 120'. The free end portion 144 extended from the fixing portion 142 is protrudes out of the dielectric layer 130 via the via hole H1.

It is worth to note that, the amount of the cantilever structure 140 and the layout thereof are adjustable according to the product requirements. The at least one cantilever structure 140 can be arranged at two opposite sides of the substrate layer 110 respectively (shown in FIG. 1E) or at one side of the substrate layer 110.

For the instant embodiment, the cantilever structure 140 can be made of a metal foil (not shown) and formed by a photolithography process and an etching process. In various embodiments, the cantilever structure 140 can be formed by a mechanical machining process such as a punching process, whereby the free end portion 144 is bent relative the fixing portion 142. Besides, the cantilever structure 140 can be formed by the aforementioned photolithography, etching, and mechanical machining processes.

To further explain the details, the method of forming the cantilever structure 140 comprises at least following steps. A photolithography process and an etching process are conducted to remove a portion of a metal foil (not shown) to define a planar pattern for formation of the cantilever structure 140. Next, a punching process is conducted to the patterned metal foil to form the cantilever structure 140, wherein the free end portion 144 is bent relative the fixing portion 142. Last, the metal foil with the cantilever structure 140 is formed on the dielectric layer 130 by pressing or adhering. However, in various embodiments, the cantilever structure 140 can be formed after pressing the metal layer onto the dielectric layer 130.

It is worth to note that, the remaining metal portions connected with the cantilever structure 140 can be patterned to faun a circuit in the aforementioned patterning process. However, the present invention is not restricted thereto; said remaining metal portions connected with the cantilever structure 140 can be completely removed.

The next step is to form a first protective layer 150a on the cantilever structure 140, wherein the first protective layer 150a is formed with at least one via hole H2, and the cantilever structure 140 further protrudes out of the first protective layer 150a via the via hole H2. It is worth to note that, the cantilever structure 140 and the first protective layer 150a can be pressed onto the dielectric layer 130 in the same or different process.

Figure 1F:
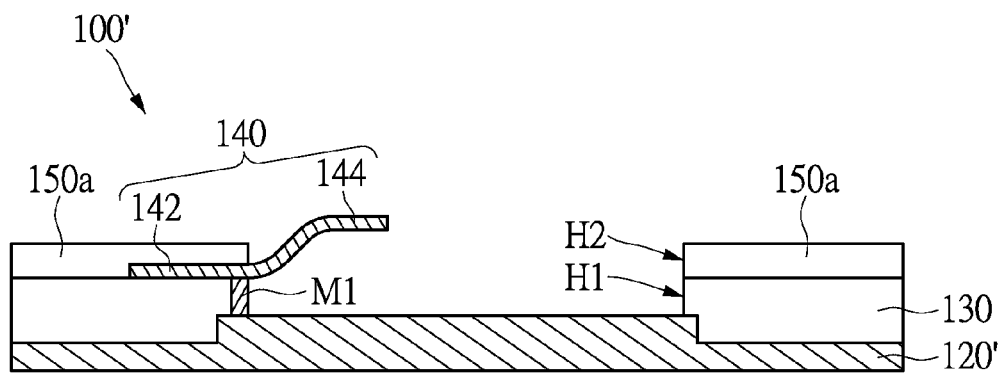
Figure 1F:
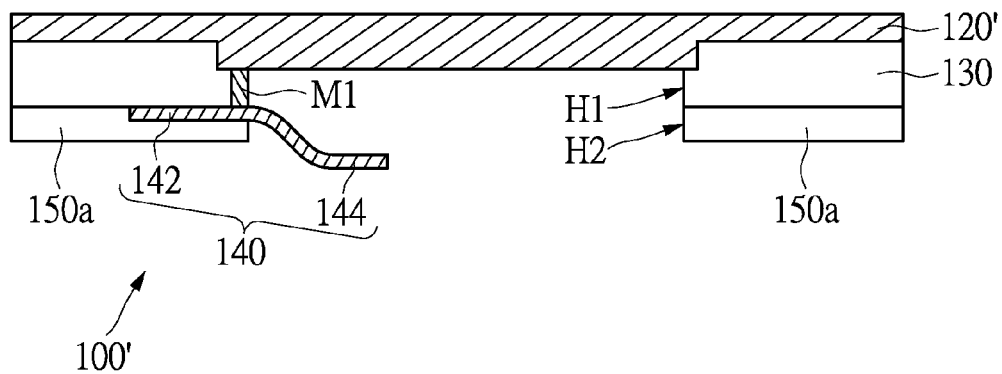

The next step, as shown in FIGS. 1E and 1F, is to substantially form at least two semi-finished connectors 100' at two opposite sides of the substrate layer 110. Specifically, the two opposite sides of the substrate layer 110 each can be combined with the one of the wiring layers 120' via the corresponding release film 116. Thus, at least two semi-finished connectors 100' can be produced at one time by peeling off the release film 116 from the second metal layer 114.

Figure 1G:
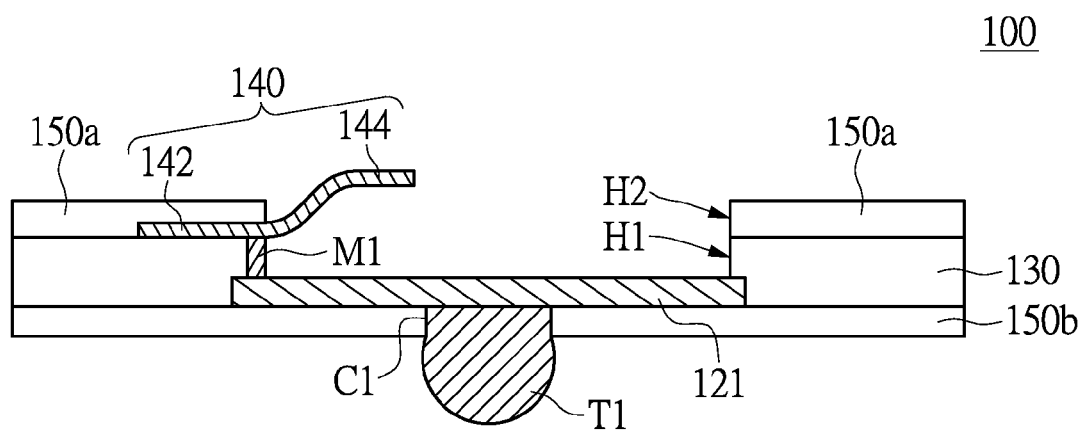

The next step, as shown in FIGS. 1G, is to selectively remove the wiring layer 120' to form a wiring layer 121 with a predetermined wiring pattern. A portion of the wiring layer 120' can be removed by etching or polishing to partially expose the substantially covered surface of the dielectric layer 130. The connector 100 can be obtained after the completion of the aforementioned steps. In various embodiments, a subtractive method can be performed on the first metal layer 120 to form the wiring layer 121 without etching or polishing the wiring layer 120'.

Referring to FIG. 1G again. After formation of the wiring layer 121, a second protective layer 150b can be formed on the wiring layer 120' and opposite to the dielectric layer 130. The second protective layer 150b is formed with at least one through hole C1 to partially expose the wiring layer 120'. For the instant embodiment, the second protective layer 150b can be a layer of dry film/wet film solder mask, and the through hole C1 can be solder mask defined (SMD) or non-solder mask defined (NSMD). A soldering material such as solder ball or solder pillar can be filled into the through hole C1 of the second protective layer 150b. Said soldering material can be replaced by the nickel-gold layer or organic solderability preservatives (OSP).

Base on the above, the two opposite sides of the substrate layer 110 each can be combined with the one of the wiring layers 120' via the corresponding release film 116. Thus, at least two semi-finished connectors 100' can be produced at one time by peeling off the release film 116 from the second metal layer 114.

As a result, at least one electrically conductive via coupled between the cantilever structure to the wiring layer can be formed without the use of a via hole plating method, whereby the overall process can be simplified in comparison with the conventional manufacturing method. Besides, the connector manufactured by the aforementioned method does not have any core layers, whereby the thickness of the connector can be reduced to meet the requirement of miniaturization The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A connector comprising:
a wiring layer;
a dielectric layer disposed on the wiring layer, wherein the dielectric layer has at least one via hole to partially expose the wiring layer;
a conductive structure disposed on the inner wall of the via hole of the dielectric layer and electrically connected to the wiring layer;
a first protective layer disposed on the dielectric layer; and
at least one cantilever structure disposed between the first protective layer and the dielectric layer, wherein the cantilever structure is electrically connected to the wiring layer through the conductive structure.

2. The connector as recited in claim 1, wherein at least part of the inner wall of the via hole of the dielectric layer is covered by the conductive structure.

3. The connector as recited in claim 1, wherein the cantilever structure is positioned in correspondence with the via hole of the dielectric layer.

4. The connector as recited in claim 1, wherein the cantilever structure has a fixing portion and a free end portion extend from the fixing portion.

5. The connector as recited in claim 4, wherein the fixing portion is arranged in a peripheral region near the via hole of the dielectric layer and connected to the wiring layer.

6. The connector as recited in claim 4, wherein the free end portion is protrudes out of the dielectric layer through the via hole.

7. The connector as recited in claim 6, wherein the free end portion is bent relative to the fixing portion.

8. The connector as recited in claim 1, wherein the first protective layer has at least one first via hole, the cantilever structure further protrudes out of the first protective layer through the first via hole.

9. The connector as recited in claim 1, wherein the wiring layer has a first portion and a second portion, the second portion exposed by the via hole of the dielectric layer is disposed on the first portion, and the conductive structure is located on the second portion.

10. The connector as recited in claim 1, wherein a bottom surface of the wiring layer is aligned with a lower surface of the dielectric layer.

11. The connector as recited in claim 10, further comprising a second protective layer disposed on the wiring layer and opposite to the dielectric layer, wherein the second protective layer covers the bottom surface of the wiring layer and the lower surface of the dielectric layer.

12. The connector as recited in claim 11, wherein the second protective layer has at least one through hole to partially expose the wiring layer.

13. The connector as recited in claim 12, wherein the second protective layer is a layer of solder mask, and the through hole is solder mask defined or non-solder defined.

14. The connector as recited in claim 12, further comprising a solder material is filled into the through hole of the second protective layer.

15. The connector as recited in claim 14, wherein the solder material comprises a solder ball, a solder pillar, a nickel-gold layer or an organic solderability preservatives.

* * * * *